(12) United States Patent
Oh et al.

(10) Patent No.: US 11,418,267 B2
(45) Date of Patent: Aug. 16, 2022

(54) RECEIVER FOR REMOVING NOISE GENERATED IN HUMAN BODY COMMUNICATION

(71) Applicant: ELECTRONICS AND TELECOMMUNICATIONS RESEARCH INSTITUTE, Daejeon (KR)

(72) Inventors: Kwang Il Oh, Daejeon (KR); Sung Eun Kim, Daejeon (KR); Tae Wook Kang, Daejeon (KR); Hyuk Kim, Daejeon (KR); Mi Jeong Park, Sejong (KR); Hyung-Il Park, Daejeon (KR); Kyung Jin Byun, Daejeon (KR); Jae-Jin Lee, Daejeon (KR); In Gi Lim, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 304 days.

(21) Appl. No.: 16/784,151

(22) Filed: Feb. 6, 2020

(65) Prior Publication Data
US 2020/0259569 A1    Aug. 13, 2020

(30) Foreign Application Priority Data

Feb. 8, 2019  (KR) .......................... 10-2019-0015229
May 29, 2019  (KR) .......................... 10-2019-0063048

(51) Int. Cl.
*H05K 7/14* (2006.01)
*H04B 13/00* (2006.01)
(Continued)

(52) U.S. Cl.
CPC ............. *H04B 13/005* (2013.01); *H03F 1/26* (2013.01); *H03H 11/1291* (2013.01); *H03F 2200/171* (2013.01); *H03F 2200/372* (2013.01)

(58) Field of Classification Search
CPC .... H01F 38/10; H01F 2038/143; H02J 17/00; H04B 3/56; H04B 2203/5483
(Continued)

(56) References Cited

U.S. PATENT DOCUMENTS 8,805,314 B2   8/2014  Katsube et al.
9,065,558 B2   6/2015  Song et al.
(Continued)

FOREIGN PATENT DOCUMENTS

CN    207321253 U  *  5/2018
JP    2000284836 A     10/2000
(Continued)

*Primary Examiner* — Quan Tra

(57) ABSTRACT

Provided is a receiver. The receiver according to the inventive concept includes a first filter circuit, a second filter circuit, and an amplifier. The first filter circuit provides a first path for first frequency components below first cutoff frequency of input frequency components and passes second frequency components except for the first frequency components of the input frequency components through second path. The second filter circuit attenuates third frequency components below a second cutoff frequency of the second frequency components. The amplifier amplifies the second frequency components including the attenuated third frequency components.

5 Claims, 11 Drawing Sheets

(51) Int. Cl.
*H03F 1/26* (2006.01)
*H03H 11/12* (2006.01)

(58) Field of Classification Search
USPC .......................................................... 307/149
See application file for complete search history.

(56) References Cited

U.S. PATENT DOCUMENTS

| | | | |
|---|---|---|---|
| 9,692,526 B2* | 6/2017 | Linnartz | H04B 13/005 |
| 10,044,449 B2 | 8/2018 | Oh et al. | |
| 2005/0004482 A1 | 1/2005 | Drakulic | |
| 2012/0154071 A1* | 6/2012 | Bradley | H03H 7/38 |
| | | | 333/133 |
| 2012/0201235 A1 | 8/2012 | Lim et al. | |
| 2017/0117003 A1 | 4/2017 | Takasu et al. | |
| 2018/0006637 A1* | 1/2018 | Chen | H03K 9/08 |

FOREIGN PATENT DOCUMENTS

| | | |
|---|---|---|
| JP | 2016015711 A | 1/2016 |
| KR | 1020100045126 A | 5/2010 |
| KR | 1020100120042 A | 11/2010 |
| KR | 20120102201 A | 9/2012 |
| KR | 1020180059721 A | 6/2018 |

\* cited by examiner

RECEIVER FOR REMOVING NOISE GENERATED IN HUMAN BODY COMMUNICATION

CROSS-REFERENCE TO RELATED APPLICATIONS

This U.S. non-provisional patent application claims priority under 35 U.S.C. § 119 of Korean Patent Application Nos. 10-2019-0015229, filed on Feb. 8, 2019, and 10-2019-0063048, filed on May 29, 2019, respectively, the entire contents of which are hereby incorporated by reference.

BACKGROUND

Embodiments of the inventive concept relate to a receiver, and more particularly, relate to a receiver configured to remove noise that is generated in a process of transferring a signal through a human body.

As information technologies develop, communication technologies between electronic devices also develop. In particular, as wireless communication technologies develop, electronic devices exchange signals through various media. To transmit and receive the signals through the various media, the electronic devices include interface circuits for supporting various protocols.

As an interest in an ubiquitous technology and a bioindustry increases, a human body communication technology that transfers the signal through the human body is attracting attention. The human body communication technology has been applied to various electronic devices designed for medical purposes, as well as mobile devices such as wearable device.

Numerous noise may occur in a process of transferring the signal through the human body. To efficiently receive the signal transferred through the human body, a receiver having a high performance is required. For example, there is a need for a receiver configured to remove noise that is generated in the process of transferring the signal through the human body.

SUMMARY

Embodiments of the inventive concept provide a receiver that may remove noise generated in human body communication.

According to an exemplary embodiment, a receiver according to the inventive concept includes a first filter circuit, a second filter circuit, and an amplifier. The first filter circuit may provide a first path for first frequency components below a first cutoff frequency of input frequency components, and may pass second frequency components except for the first frequency components of the input frequency components through a second path. The second filter circuit may attenuate third frequency components below a second cutoff frequency of the second frequency components. The amplifier may amplify the second frequency components that include the attenuated third frequency components.

According to an exemplary embodiment, a receiver according to the inventive concept includes a filter circuit and an amplifier. The filter circuit may pass first frequency components below a first cutoff frequency of reference frequency components received through a first node to a second node, and may pass second frequency components below the first cutoff frequency of input frequency components received through the second node to the first node. The amplifier may perform an amplification operation, based on third frequency components except for the first frequency components of the reference frequency components, and fourth frequency components except for the second frequency components of the input frequency components.

According to an exemplary embodiment, a receiver according to the inventive concept includes a filter circuit and an amplifier. The filter circuit may pass noise included in an input signal received through a first node to a second node, and may receive a reference signal through the second node. The amplifier may amplify a difference between a level of a biosignal included in the input signal and a level of the reference signal to output data of the biosignal. Wherein a frequency of the noise is less than a frequency of the biosignal.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Embodiments of the inventive concept will be described below in more detail with reference to the accompanying drawings. In the following descriptions, details such as detailed configurations and structures are provided merely to assist in an overall understanding of embodiments of the inventive concept. Modifications of the embodiments described herein can be made by those skilled in the art without departing from the spirit and scope of the inventive concept. Furthermore, descriptions of well-known functions and structures are omitted for clarity and brevity. The terms used in this specification are defined in consideration of the functions of the inventive concept and are not limited to specific functions. Definitions of terms may be determined based on the description in the detailed description.

In the following drawings or the detailed description, modules may be connected to others in addition to the components illustrated in drawing or described in the detailed description. The circuits or components may be directly or indirectly connected. The circuits or components may be communicatively connected or may be physically connected.

Unless defined otherwise, all tennis including technical and scientific terms used herein have the same meaning as can be understood by one of ordinary skill in the art to which the inventive concept belongs. Generally, terms defined in the dictionary are interpreted to have equivalent meaning to the contextual meanings in the related art and are not to be construed as having ideal or overly formal meaning unless expressly defined in the text.

Figure 1:
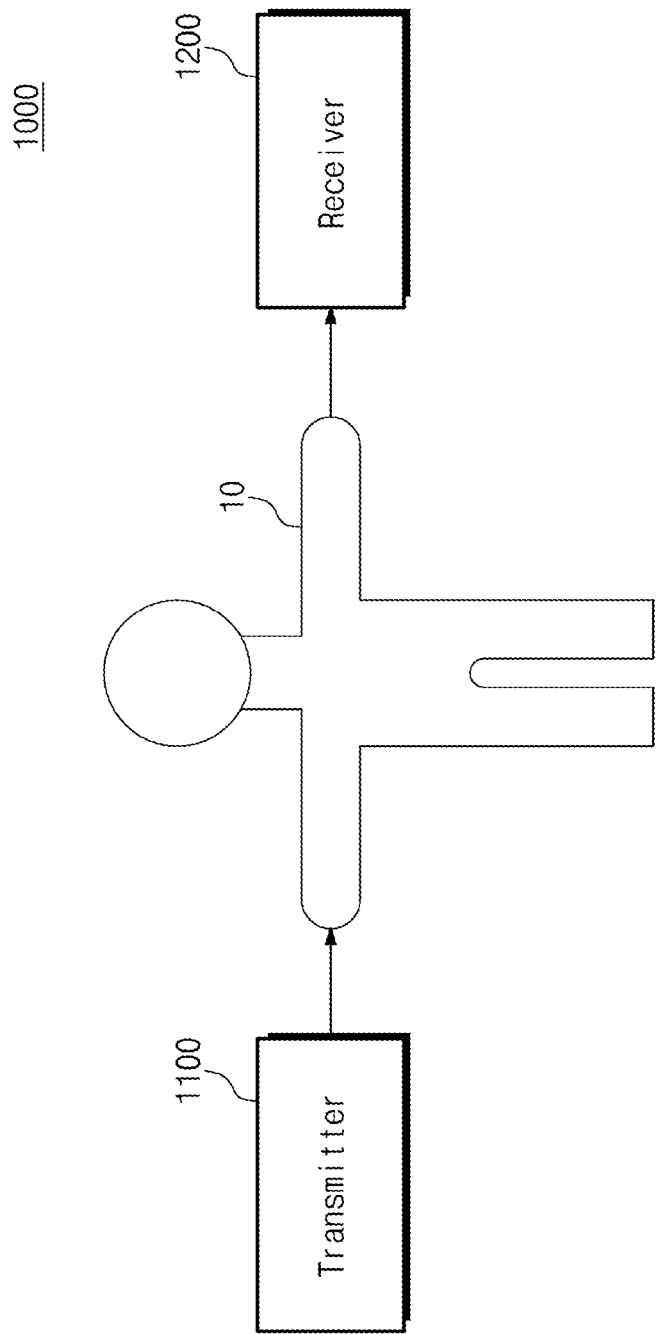
FIG. 1 is a block diagram illustrating a human body communication system according to an embodiment of the inventive concept.

FIG. 1 is a block diagram illustrating a human body communication system according to an embodiment of the inventive concept.

Referring to FIG. 1, a human body communication system 1000 may include a transmitter 1100 and a receiver 1200 that communicate through a human body 10. In the present specification, exemplary configurations and operations of the human body communication system 1000 that communicate through the human body 10 will be described, but it will be understood that the human body communication system 1000 may communicate through various media. By way of example, the media of the human body communication system 1000 may be altered and modified with various living bodies such as plants and animals.

Figure 11:
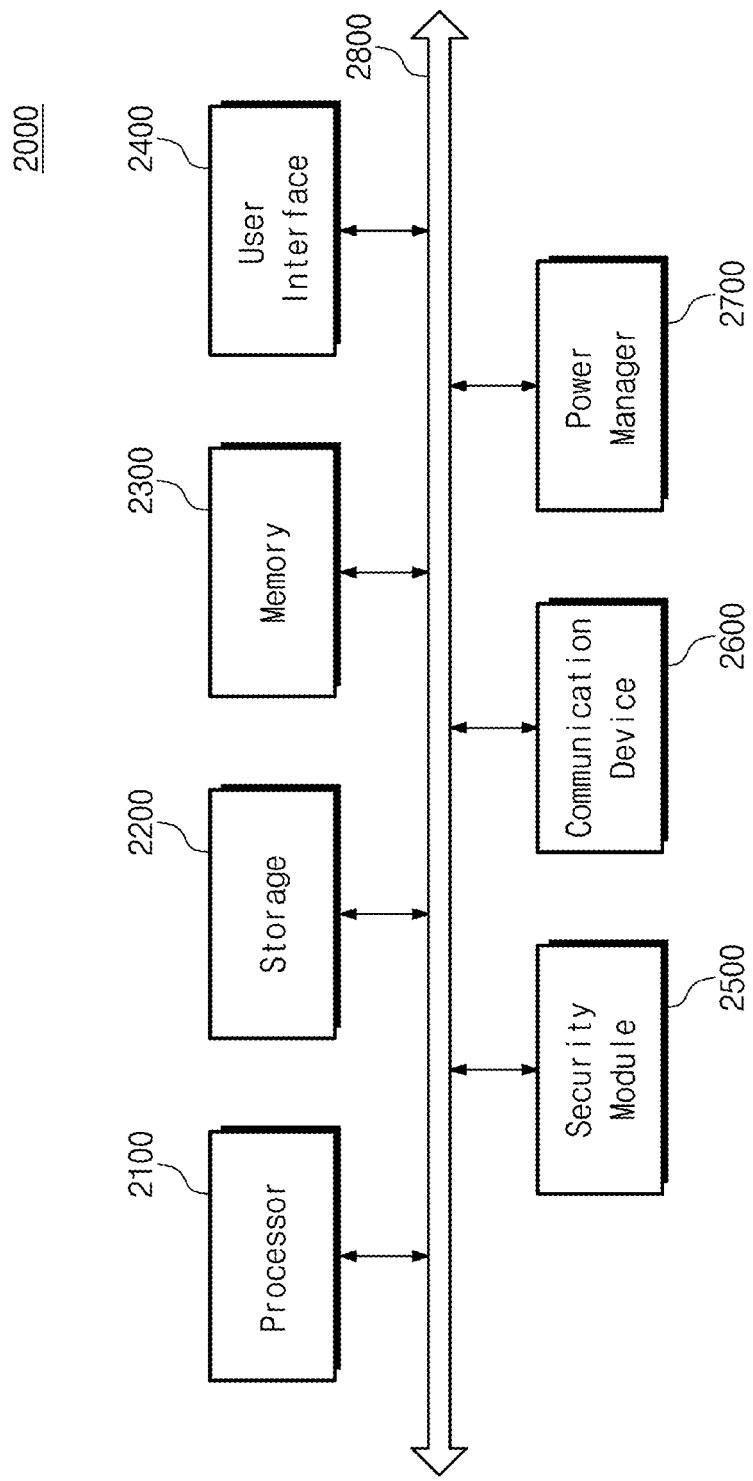
FIG. 11 is a block diagram illustrating an exemplary configuration of an electronic device including a human body communication system of FIG. 1.

As an example, the transmitter 1100 and the receiver 1200 may be included in an electronic device for configuring the human body communication system 1000 (referring to FIG. 11). For example, the electronic device may be one of a personal computer (PC), a workstation, a notebook computer, a mobile device, a wearable device, etc. The electronic device may further include at least one component (e.g., a processor, a memory, a storage, etc.) not illustrated in FIG. 1. Alternatively, the electronic device may not include at least one of components illustrated in FIG. 1.

The transmitter 1100 may transmit a signal (hereinafter, referred to as a biosignal) including various information through the human body 10. For example, the biosignal may include information for an operation of the electronic device including the human body communication system 1000. The transmitter 1100 may be in contact with the human body 10 or may be spaced apart from an epidermis of the human body 10 by a small distance to transmit the biosignal. For example, the transmitter 1100 may support various types of protocols for transm ㅋ ㅋ .itting the biosignal through the human body 10.

The biosignal transmitted from the transmitter 1100 may represent data processed or to be processed by various components included in the electronic device. The data of the biosignal may be associated with various information that is transmitted from an outside of the human body communication system 1000. For example, the information included in the biosignal may be represented as data to be processed by the processor included in the electronic device. For example, the information of the biosignal may be represented as data to be stored in the memory included in the electronic device.

The receiver 1200 may receive the biosignal transmitted through the human body 10. For example, the receiver 1200 may support various types of protocols for receiving the biosignal through the human body 10. The receiver 1200 may acquire data of the received biosignal. The receiver 1200 may acquire information (i.e., information acquired from the outside of the human body communication system 1000) included in the biosignal, based on the data acquired from the biosignal.

Although not illustrated in FIG. 1, the receiver 1200 may receive a reference signal to be used to amplify the biosignal from the outside of the human body communication system 1000. For example, the receiver 1200 may receive the reference signal from ground or air outside the human body communication system 1000.

In addition, the receiver 1200 may receive a signal (hereinafter, referred to as a noise signal) including noise through the human body 10. For example, the noise may be generated inside the human body communication system 1000 due to energy supplied from the outside of the human body 10. For example, the energy radiated by a light source (e.g., a fluorescent lamp) from the outside of the human body 10 may be absorbed by the human body 10. The noise signal may be generated inside the human body by the absorbed energy. The receiver 1200 may receive the noise signal generated in the human body 10.

The receiver 1200 may perform an amplification operation to accurately acquire the data of the biosignal, based on the signal that is received from the transmitter 1100, the reference signal, and the noise signal. That is, the receiver 1200 may perform the amplification operation to accurately acquire the data of the biosignal that is weakened in a process of being received through the human body 10. For example, the receiver 1200 may perform the amplification operation, based on a difference between a level of the signal received from the transmitter 1100 and a level of the reference signal.

The receiver 1200 may perform operations for removing noise included in the noise signal to accurately acquire the data of the biosignal. Exemplary configurations and operations of the receiver 1200 will be described in more detail with reference to FIGS. 2 to 10.

Figure 2:
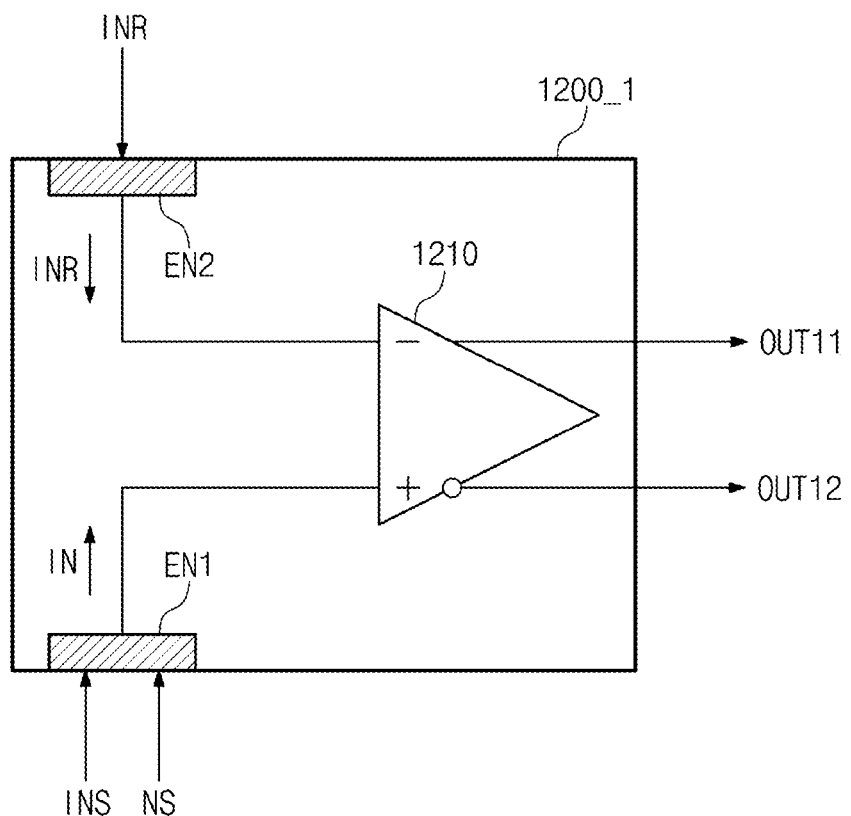
FIG. 2 is a conceptual diagram illustrating an exemplary configuration of a receiver of FIG. 1.

FIG. 2 is a conceptual diagram illustrating an exemplary configuration of a receiver of FIG. 1.

The receiver 1200 of FIG. 1 may include a receiver 1200_1 of FIG. 2. Referring to FIG. 2, the receiver 1200_1 may include electrodes EN1 and EN2 and an amplifier 1210.

The receiver 1200_1 may receive a reference signal INR from the outside of the human body communication system 1000 through the electrode EN2. The receiver 1200_1 may receive a biosignal INS transmitted from the transmitter 1100 through the human body 10 through the electrode EN1. The receiver 1200_1 may receive a noise signal NS generated at the human body 10 through the electrode EN1.

Since both the noise signal NS and the biosignal INS are received through the electrode EN1, the receiver 1200_1 may receive an input signal IN including the biosignal INS and the noise signal NS through the electrode EN1. For example, a level of the input signal IN may correspond to a sum of a level of the biosignal INS and a level of the noise signal NS. The biosignal INS, the noise signal NS, and the input signal IN will be described in more detail with reference to FIG. 3.

The amplifier 1210 may receive the reference signal INR through an inverting terminal and may receive the input signal IN through a non-inverting terminal. The amplifier 1210 may output signals OUT11 and OUT12, based on the reference signal INR and the input signal IN. For example, the amplifier 1210 may output the signals OUT11 and OUT12, based on the difference between the level of the reference signal INR and the level of the input signal IN.

As an example, when a gain of the amplifier 1210 is K, the levels of the signals OUT11 and OUT12 correspond to a value that is obtained by multiplying the difference between the level of reference signal INR and the level of input signal IN by K. The levels of the signals OUT11 and OUT12 may be complementary. Thus, the sum of the levels of the signals OUT11 and OUT12 may be uniform. However, uniform in the present specification means that a specific value does not change or only changes minutely over time.

Since the signals OUT11 and OUT12 are generated based on the input signal IN including the biosignal INS, the signals OUT11 and OUT12 may represent data of the biosignal INS. As described with reference to FIG. 1, to transmit the data of the biosignal INS to another component of the electronic device, the receiver 1200_1 may output the signals OUT11 and OUT12 to the component.

Figure 3:
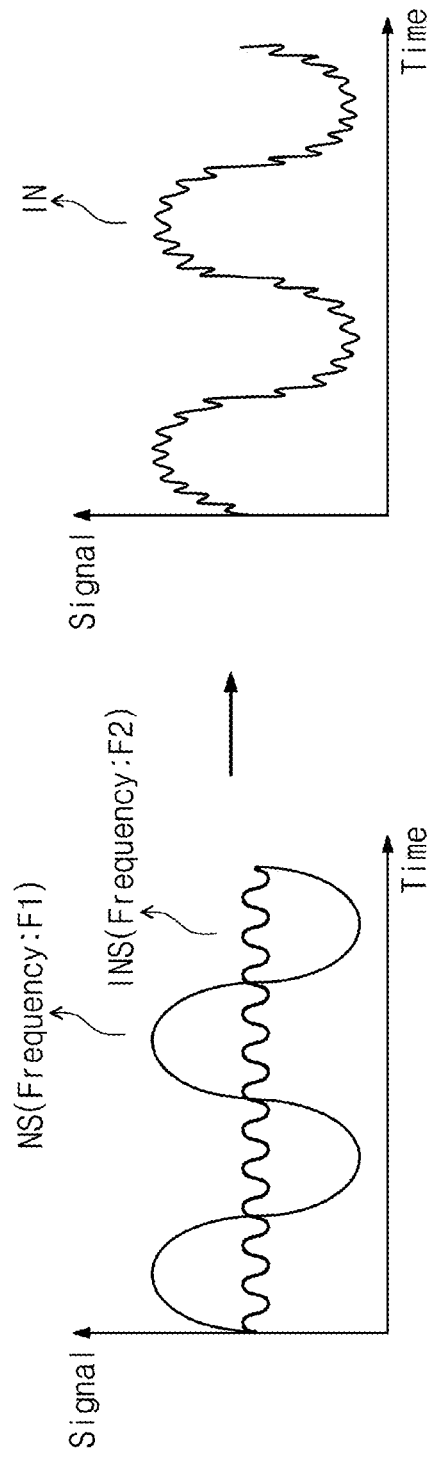
FIG. 3 are graphs describing signals received by a receiver of FIG. 1.

FIG. 3 are graphs describing signals received by a receiver of FIG. 1.

As described with reference to FIGS. 1 and 2, the receiver 1200 may receive the biosignal INS received from the transmitter 1100 through the human body 10 and the noise signal NS including noise. The noise signal NS may include noise of a relatively low frequency. In the example of FIG. 3, the frequency of the noise signal NS may be F1, and the frequency of the biosignal INS may be F2. Since the noise signal NS includes noise having a low frequency, the frequency F1 of the noise signal NS may be less than the frequency F2 of the biosignal INS.

As the noise signal NS and the biosignal INS are received through the electrode EN2, the input signal IN may be generated. The input signal IN may include the noise signal NS and the biosignal INS. Therefore, the input signal IN may include the noise. For example, the input signal IN may include the noise of the frequency F1.

Figure 4:
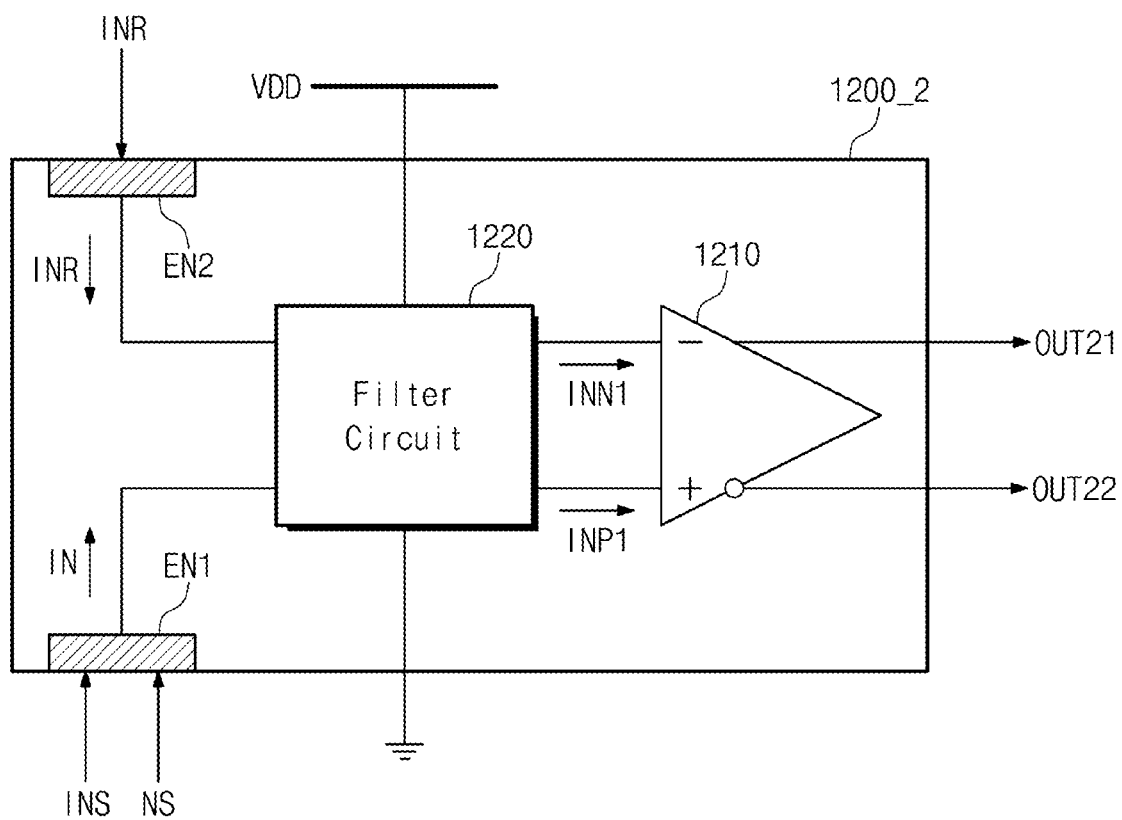
FIG. 4 is a conceptual diagram illustrating an exemplary configuration of a receiver of FIG. 1.

FIG. 4 is a conceptual diagram illustrating an exemplary configuration of a receiver of FIG. 1.

The receiver 1200 of FIG. 1 may include a receiver 1200_2 of FIG. 4. Referring to FIG. 4, the receiver 1200_2 may include electrodes EN1 and EN2, the amplifier 1210, and a filter circuit 1220. Comparing FIG. 4 with FIG. 2, the receiver 1200_2 of FIG. 4 may further include the filter circuit 1220.

Exemplary configurations and operations of the electrodes EN1 and EN2 and the amplifier 1210 are similar to those described with reference to FIG. 2, respectively, and thus redundant description will be omitted. The filter circuit 1220 may receive the input signal IN from the electrode EN1. The filter circuit 1220 may receive the reference signal INR from the electrode EN2. The filter circuit 1220 may receive an operating voltage VDD and a ground voltage.

As an example, the filter circuit 1220 may receive the operating voltage VDD from the electronic device such as a voltage supply inside or outside the receiver 1200_2. The operating voltage VDD may have an appropriate level for the operation of the amplifier 1210. For example, the operating voltage VDD may have a level that is set by a designer for a normal operation of the amplifier 1210.

The filter circuit 1220 may receive the ground voltage from the ground terminal. In the example of FIG. 4, the filter circuit 1220 that is configured to receive the ground voltage from the ground terminal will be described, but it will be appreciated that the ground voltage may be changed and modified to various levels of voltage for the normal operation of the amplifier 1210.

The filter circuit 1220 may output signals INN1 and INP1, based on the input signal IN and the reference signal INR. The filter circuit 1220 may be configured to remove the noise included in the input signal IN. As an example, the filter circuit 1220 may be configured to attenuate frequency components below a cutoff frequency of frequency components of the input signal IN and the reference signal INR. For example, the filter circuit 1220 may include a configuration of a high pass filter.

The cutoff frequency of the filter circuit 1220 may be determined in consideration of the frequency F1 of the noise signal NS and the frequency F2 of the biosignal INS. For example, the filter circuit 1220 may be designed such that the cutoff frequency of the filter circuit 1220 is greater than the frequency F1 of the noise signal NS and less than the frequency F2 of the biosignal INS.

The filter circuit 1220 may attenuate the frequency components below the cutoff frequency of the frequency components of the reference signal INR, and output the signal INN1 including the attenuated frequency components to the inverting terminal of the amplifier 1210. The filter circuit 1220 may attenuate the frequency components below the cutoff frequency of the frequency components of the input signal IN, and output the signal INP1 including the attenuated frequency components to the non-inverting terminal of the amplifier 1210.

The amplifier 1210 may output signals OUT21 and OUT22, based on the signals INN1 and INP1. For example, the amplifier 1210 may output the signals OUT21 and OUT22 having a level that is obtained by multiplying a difference between the levels of the signals INN1 and INP1 by the gain.

An exemplary configuration of the filter circuit 1220 will be described in more detail with reference to FIG. 5. Exemplary operations of the filter circuit 1220 will be described in more detail with reference to FIG. 6.

Figure 5:
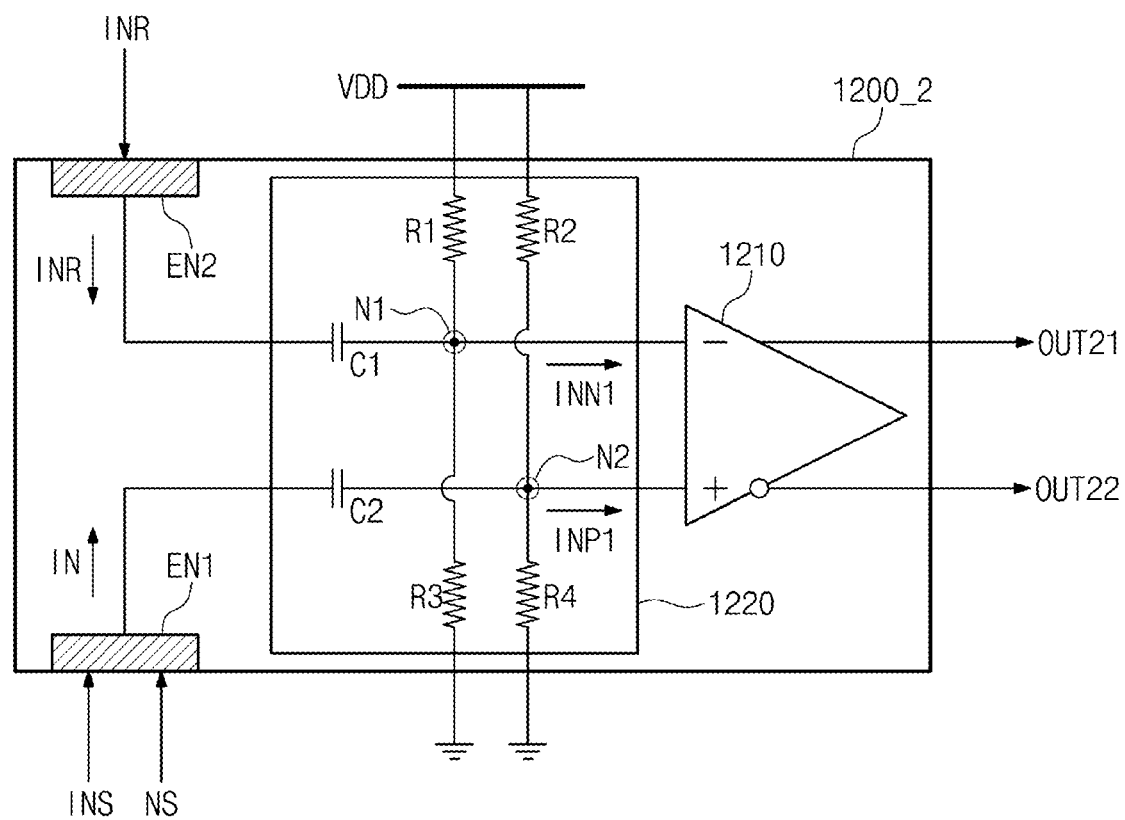
FIG. 5 is a circuit diagram illustrating an exemplary configuration of a receiver of FIG. 4.

FIG. 5 is a circuit diagram illustrating an exemplary configuration of a receiver of FIG. 4.

Referring to FIG. 5, the filter circuit 1220 may include resistors R1 to R4 and capacitive elements C1 and C2.

In FIG. 5, each of the capacitive elements C1 and C2 is illustrated as one capacitive element, but each of the capacitive elements C1 and C2 may include at least one of capacitive elements connected in parallel to one another, capacitive elements connected in series to one another, and various combinations of the capacitive elements connected in series to one another and the capacitive elements connected in parallel to one another, instead of one capacitive element.

In FIG. 5, each of the resistors R1 to R4 is illustrated as one resistor, but each of the resistors R1 to R4 may include at least one of resistors connected in parallel to one another, resistors connected in series to one another, and various combinations of the resistors connected in series to one another and the resistors connected in parallel to one another, instead of one resistor.

The capacitive element C1 may be connected between the electrode EN2 and a node N1. The resistor R1 may be connected between a supply terminal of the operating voltage VDD and the node N1. The resistor R3 may be connected between the node N1 and the ground terminal. The capacitive element C2 may be connected between the electrode EN1 and a node N2. The resistor R2 may be connected between the supply terminal of the operating voltage VDD and the node N2. The resistor R4 may be connected between the node N2 and the ground terminal.

The capacitive element C1 may receive the reference signal INR from the electrode EN2. The capacitive element C1 may pass some frequency components of the frequency components of the reference signal INR. The signal INN1 that includes the frequency components passed through the capacitive element C1 may be output to the amplifier 1210 through the node N1.

As an example, a first cutoff frequency may be determined based on an element value of the capacitive element C1. For a frequency band below the first cutoff frequency, levels of the frequency components included in the signal INN1 may be less than levels of the frequency components included in the reference signal INR.

The capacitive element C2 may receive the input signal IN from the electrode EN1. The capacitive element C2 may pass some frequency components of the frequency components of the input signal IN. The signal INP1 that includes the frequency components passed through the capacitive element C2 may be output to the amplifier 1210 through the node N2.

As an example, a second cutoff frequency may be determined based on an element value of the capacitive element C2. For a frequency band below the second cutoff frequency, levels of the frequency components included in the signal INP1 may be less than levels of the frequency components included in the input signal IN.

Signals INP1 and INN1 may be used as differential inputs of the amplifier 1210. Accordingly, the filter circuit 1220 may be designed such that the signals INP1 and INN1 corresponding to each other are output to the amplifier 1210. For example, element values of the capacitive elements C1 and C2 may be set such that the first cutoff frequency associated with the capacitive element C1 corresponds to the second cutoff frequency associated with the capacitive element C2.

For convenience of description below, an embodiment in which the first cutoff frequency is the same as the second cutoff frequency will be described. Hereinafter, both the first cutoff frequency and the second cutoff frequency are referred to as a cutoff frequency of the filter circuit 1220. However, it will be appreciated that the first cutoff frequency and the second cutoff frequency may be variously modified and changed for the operations described with reference to FIG. 5.

Figure 6:
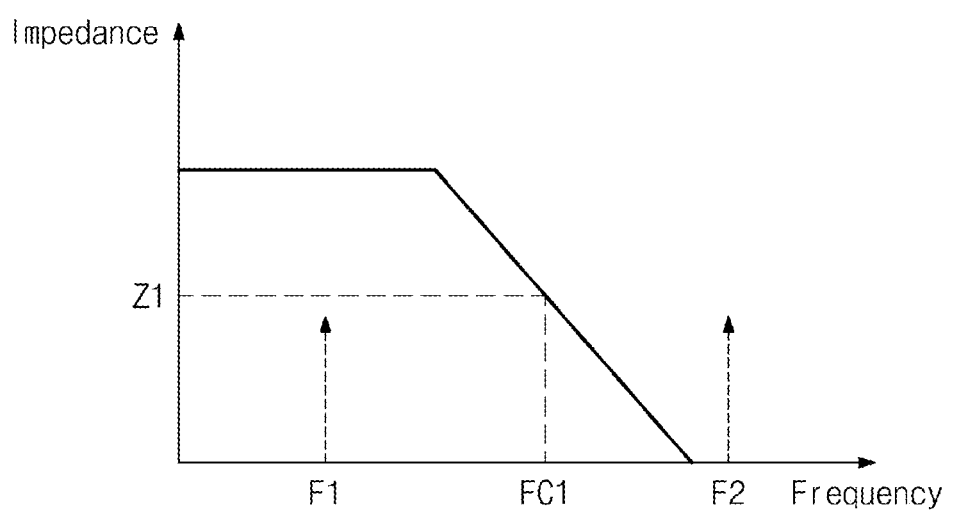
FIG. 6 is a graph for describing operations of a filter circuit of FIG. 4.

FIG. 6 is a graph for describing operations of a filter circuit of FIG. 4. In the example of FIG. 6, an x-axis may represent a frequency and a y-axis may represent a magnitude of an impedance of the filter circuit 1220 of FIG. 4.

As described with reference to FIG. 5, the filter circuit 1220 of FIG. 4 may have the cutoff frequency that is determined based on at least one of the capacitive elements C1 and C2. In the example of FIG. 6, the cutoff frequency of filter circuit 1220 may be FC1. For the frequency of FC1, the impedance of filter circuit 1220 may be Z1. The impedance of the filter circuit 1220 at a frequency band less than the cutoff frequency FC1 may be greater than the impedance of the filter circuit 1220 at a frequency band greater than the cutoff frequency FC1. Accordingly, the filter circuit 1220 may attenuate the frequency component having a frequency less than the cutoff frequency FC1.

The frequency F1 of the noise signal NS may be less than the cutoff frequency FC1, and the frequency F2 of the biosignal INS may be greater than the cutoff frequency FC1. Therefore, the noise included in the input signal IN may be attenuated by the filter circuit 1220. A level of the noise included in the signal INP1 may be less than a level of the noise included in the input signal IN.

The amplifier 1210 may output the signals OUT21 and OUT22, based on the signal INP1 including less noise. Levels of noises included in the signals OUT21 and OUT22 may be less than the levels of noises included in the signals OUT11 and OUT12 of FIG. 2. Components of the electronic device including the human body communication system 1000 may operate based on the signals OUT21 and OUT22 including only a small level of noise.

Figure 7:
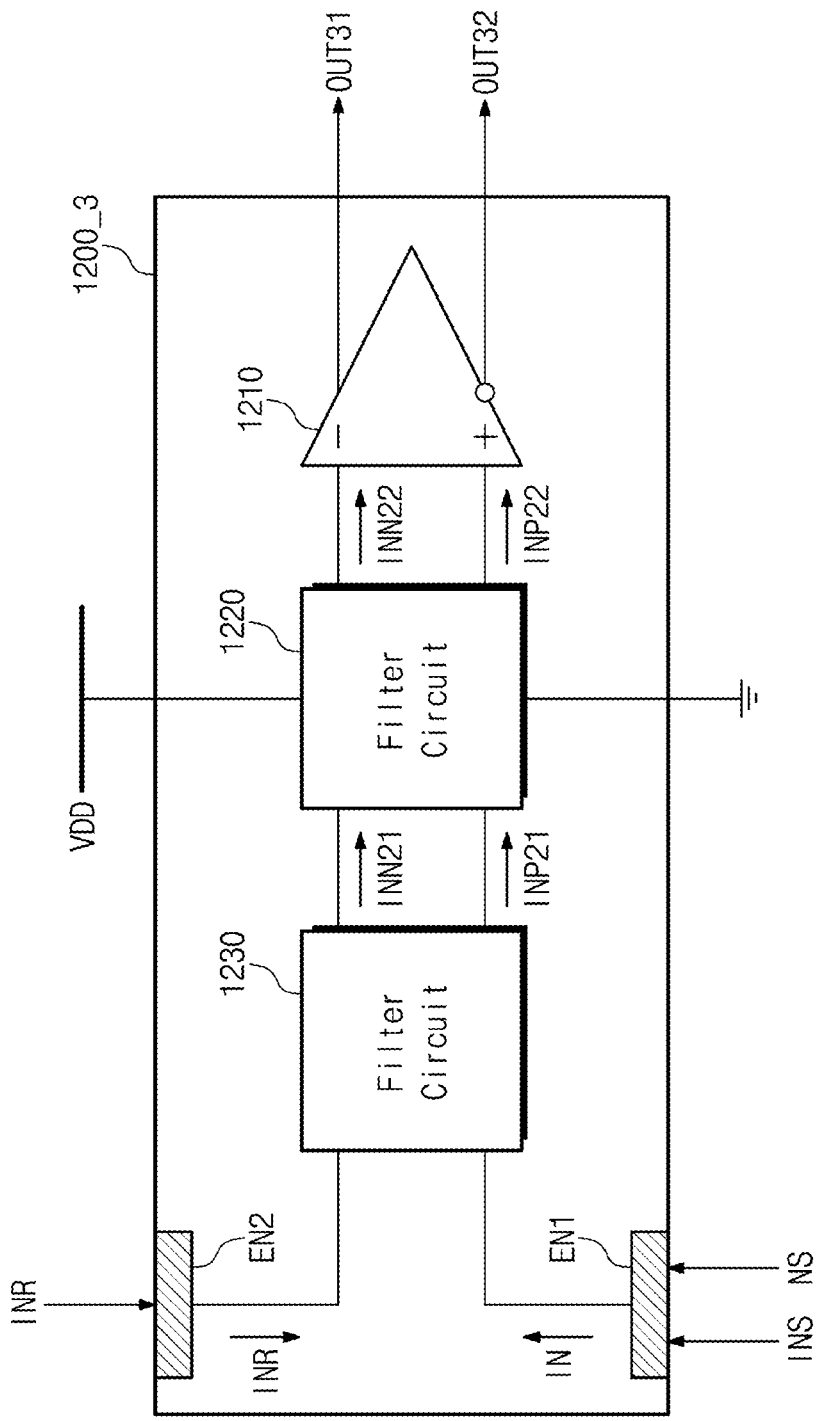
FIG. 7 is a conceptual diagram illustrating an exemplary configuration of a receiver of FIG. 1 according to an embodiment of the inventive concept.

FIG. 7 is a conceptual diagram illustrating an exemplary configuration of a receiver of FIG. 1 according to an embodiment of the inventive concept.

The receiver 1200 of FIG. 1 may include a receiver 1200_3 of FIG. 7. Referring to FIG. 7, the receiver 1200_3 may include electrodes EN1 and EN2, the amplifier 1210, and filter circuits 1220 and 1230. Comparing FIG. 7 with FIG. 2, the receiver 1200_3 of FIG. 7 may further include filter circuits 1220 and 1230.

Exemplary configurations and operations of the electrodes EN1 and EN2 and the amplifier 1210 are similar to those described with reference to FIG. 2, respectively, and thus redundant description will be omitted. Exemplary configurations and operations of the filter circuit 1220 are similar to those described with reference to FIG. 4, respectively, and thus redundant descriptions will be omitted. The filter circuit 1230 may receive the input signal IN from the electrode EN1. The filter circuit 1230 may receive the reference signal INR from the electrode EN2.

The filter circuit 1230 may output signals INN21 and INP21 based on the input signal IN and the reference signal INR. The filter circuit 1230 may be configured to remove the noise included in the input signal IN. For example, the filter circuit 1230 may provide a separate path (a path other than the path to the filter circuit 1220) for frequency components below the cutoff frequency of the frequency components of the reference signal INR, and for frequency components below the cutoff frequency of the frequency components of the input signal IN.

The cutoff frequency of the filter circuit 1230 may be determined in consideration of the frequency F1 of the noise signal NS and the frequency F2 of the biosignal INS. For example, the filter circuit 1220 may be designed such that the cutoff frequency of the filter circuit 1230 is greater than the frequency F1 of the noise signal NS and less than the frequency F2 of the biosignal INS.

As the frequency components below the cutoff frequency that is included in the reference signal INR and the input signal IN are transferred through the separate path of the filter circuit 1230, frequency components below the cutoff frequency included in the signals INN21 and INP21 that are output from the filter circuit 1230 may be attenuated. That is, noise of F1 below the cutoff frequency may be removed by the filter circuit 1230.

The filter circuit 1220 may further remove the noise included in the signals INN21 and INP21. The filter circuit 1220 may output signals INN22 and INP22 by passing the signals INN21 and INP21. The amplifier 1210 may output signals OUT31 and OUT32, based on the signals INN22 and INP22. For example, the amplifier 1210 may output the signals OUT31 and OUT32 having a level that is obtained by multiplying a difference between the levels of the signals INN22 and INP22 by a gain.

An exemplary configuration of the filter circuit 1230 will be described in more detail with reference to FIG. 8. Exemplary operations of the filter circuit 1230 will be described in more detail with reference to FIG. 9.

Figure 8:
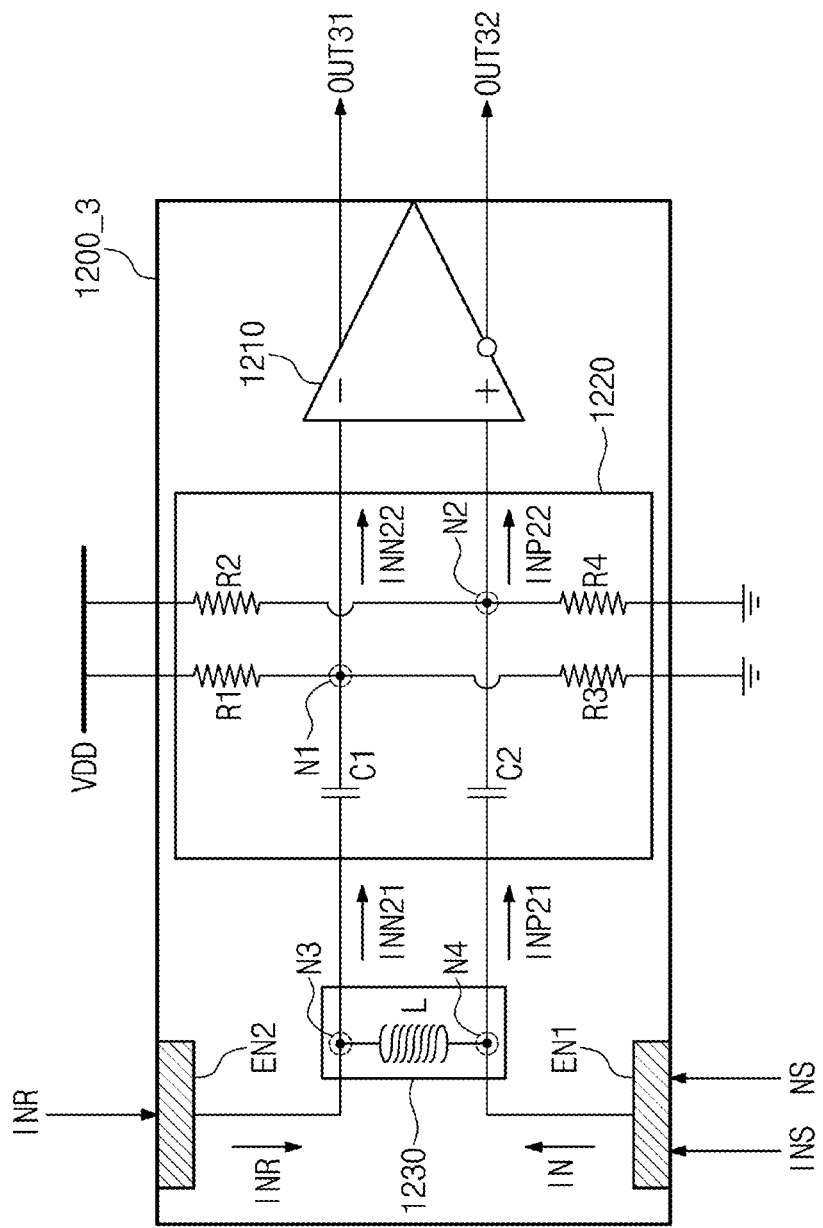
FIG. 8 is a circuit diagram illustrating an exemplary configuration of a receiver of FIG. 7.

FIG. 8 is a circuit diagram illustrating an exemplary configuration of a receiver of FIG. 7.

Referring to FIG. 8, the filter circuit 1230 may include an inductive element L. In FIG. 8, the inductive element L is illustrated as one inductive element. The inductive element L may include at least one of inductive elements connected in parallel to one another, inductive elements connected in series to one another, and various combinations of the inductive elements connected in parallel to one another and the inductive elements connected in series to one another, instead of one inductive element.

The inductive element L may be connected between the nodes N3 and N4. The electrode EN2 may be connected to the node N3. The electrode EN1 may be connected to the node N4. Exemplary configurations and operations of the electrodes EN1 and EN2, the filter circuit 1220, and the amplifier 1210 are similar to those described with reference to FIG. 5, respectively, and thus redundant descriptions will be omitted.

The inductive element L may receive the reference signal INR through the node N3. The inductive element L may pass some frequency components of the frequency components of the reference signal INR. As an example, the cutoff frequency may be determined based on an element value of the inductive element L. The inductive element L may provide a path to frequency components that have a frequency less than the cutoff frequency of frequency components included in the reference signal INR.

For frequency band below the cutoff frequency, some frequency components included in the reference signal INR may pass through the inductive element instead of the path to the filter circuit 1220. Thus, for a frequency band below the cutoff frequency, levels of the frequency components included in the signal INN21 may be less than levels of the frequency components included in the reference signal INR.

The inductive element L may receive the input signal IN through the node N4. The inductive element L may pass some frequency components of the frequency components of the input signal IN. For example, the inductive element L may provide a path to frequency components that have a frequency less than the cutoff frequency of frequency components included in the input signal IN.

For the frequency band below the cutoff frequency, some frequency components included in the input signal IN may pass through the inductive element instead of being transmitted to the filter circuit 1220. Therefore, for the frequency band below the cutoff frequency, levels of the frequency components included in the signal INP21 may be less than levels of the frequency components included in the input signal IN. The signals INN22 and INP22 to be provided as differential inputs of amplifier 1210 may be generated based on signals INN21 and INP21.

Figure 9:
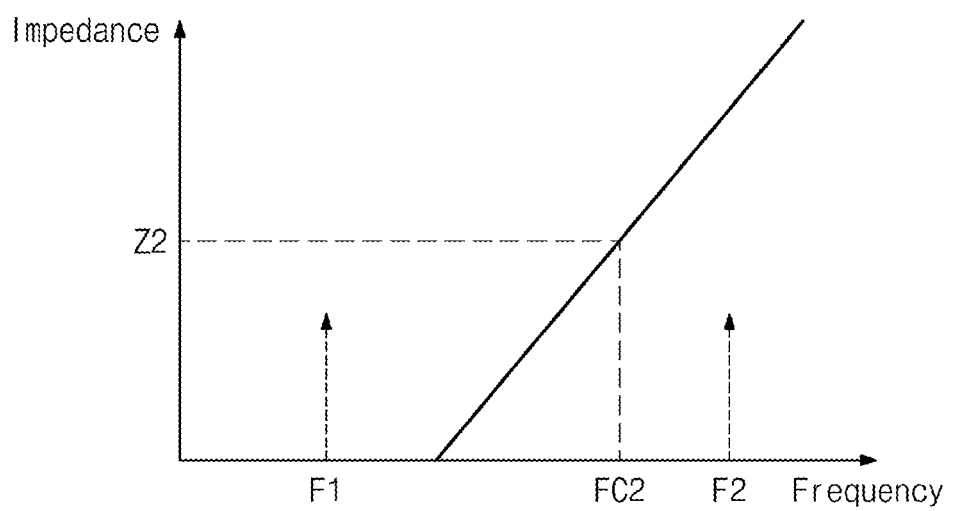
FIG. 9 is a graph for describing operations of a filter circuit of FIG. 7.

FIG. 9 is a graph for describing operations of a filter circuit of FIG. 7. In an example of FIG. 9, an x-axis may represent a frequency and a y-axis may represent a magnitude of an impedance of the filter circuit 1230 of FIG. 7.

As described with reference to FIG. 8, the filter circuit 1230 of FIG. 7 may have a cutoff frequency that is determined based on the inductive element L. In the example of FIG. 9, the cutoff frequency of the filter circuit 1230 may be FC2. For the frequency of FC2, the impedance of filter circuit 1230 may be Z2.

The impedance of the filter circuit 1230 at a frequency band less than the cutoff frequency FC2 may be less than the impedance of the filter circuit 1230 at a frequency band greater than the cutoff frequency FC2. Thus, filter circuit 1230 may pass frequency components that have a frequency less than the cutoff frequency FC2 between the nodes N3 and N4.

The frequency F1 of the noise signal NS may be less than the cutoff frequency FC2, and the frequency F2 of the biosignal INS may be greater than the cutoff frequency FC2. Noise of the noise signal NS included in the input signal IN may be transferred to a path (i.e., a path between the nodes N3 and N4) that is provided by the filter circuit 1230. Therefore, the level of noise included in the signal INP21 may be less than the level of noise included in the input signal IN.

Since the signal INP22 is generated based on the signal INP21 including less noise, the amplifier 1210 may output the signals OUT31 and OUT32, based on the signal INP22 including the less noise. The levels of noises included in the signals OUT31 and OUT32 may be less than the levels of noises included in the signals OUT11 and OUT12 of FIG. 2 and the signals OUT21 and OUT22 of FIG. 4.

Components of the electronic device including the human body communication system 1000 may operate based on the signals OUT31 and OUT32 including the less noise. Accordingly, the components of the electronic device may correctly acquire data of the signals OUT31 and OUT32.

Figure 10:
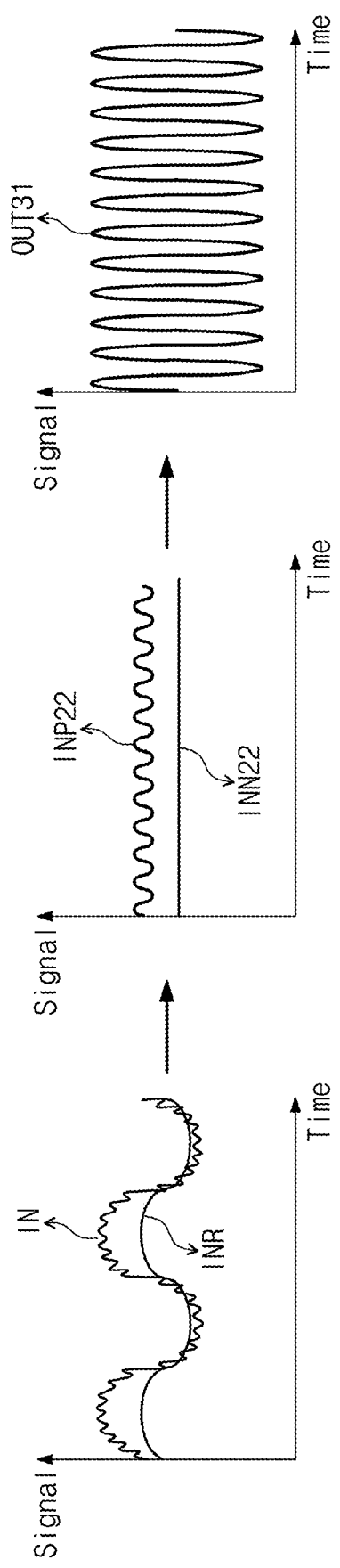
FIG. 10 are graphs for describing operations of a receiver of FIG. 7.

FIG. 10 are graphs for describing operations of a receiver of FIG. 7.

The input signal IN may be received through the electrode EN1, and the reference signal INR may be received through the electrode EN2. The input signal IN may include noise having a relatively low frequency.

Noise included in the input signal IN and the reference signal INR may be removed by the filter circuits 1220 and 1230. Therefore, when the signal INP22 is compared with the input signal IN, a level of the low frequency component included in the signal INP22 may be less than a level of the low frequency component included in the input signal IN. In addition, when the signal INN22 is compared with the reference signal INR, a level of the low frequency component included in the signal INN22 may be less than a level of the low frequency component included in the reference signal INR.

The amplifier 1210 may output the signal OUT31, based on the signals INP22 and INN22. A level of the signal OUT31 may be associated with to a difference between the levels of the signals INP22 and INN22. For example, the level of the signal OUT31 may have a value that is obtained by multiplying a difference between the levels of the signals INP22 and INN22 by a gain of the amplifier 1210. Accordingly, the magnitude of the signal OUT31 may be greater than the magnitude of the signal INP22.

FIG. 11 is a block diagram illustrating an exemplary configuration of an electronic device including a human body communication system of FIG. 1.

An electronic device 2000 may include a processor 2100, storage 2200, a memory 2300, a user interface 2400, a security module 2500, a communication device 2600, a power manager 2700, and a bus 2800. However, components of the electronic device 2000 are not limited to an embodiment of FIG. 11. The electronic device 2000 may not include one or more of the components illustrated in FIG. 11. Alternatively, the electronic device 2000 may further include at least one component that is not illustrated in FIG. 11.

The processor 2100 may control or manage operations of the components of the electronic device 2000. For example, the processor 2100 may be implemented as a general purpose processor, a dedicated processor, or an application processor.

As an example, the processor 2100 may include a single core or a plurality of processor cores (e.g., a Multi-Core such as a Dual-Core, a Quad-Core, a Hexa-Core, etc.). In an example, the processor 2100 may include dedicated circuitry (e.g., Field Programmable Gate Arrays (FPGAs), Application Specific Integrated Circuits (ASICs)) including one or more processor cores, or a System on Chip (SoC). For example, the processor 2100 may further include a cache memory located inside or outside.

The processor 2100 may process various operations to operate the electronic device 2000. For example, a signal including information may be received from another electronic device or system external to the human body communication system 1000. The receiver 1200 may output signals representing data corresponding to the information. For example, the receiver 1200 including the receiver 1200_3 may output signals OUT31 and OUT32 representing data to the processor 2100. The processor 2100 may process data obtained from the signals OUT31 and OUT32 to obtain information transferred from the outside of the human body communication system 1000.

The storage 2200 may store data regardless of power supply. For example, the storage 2200 may non-transitory store data processed or to be processed by the processor 2100. For example, the storage 2200 may non-temporarily store data that are obtained from the signals OUT31 and OUT32 and processed by the processor 2100.

As an example, the storage 2200 may include at least one of various nonvolatile memories, such as a flash memory, a PRAM, an MRAM, a ReRAM, an FRAM, etc. For example, the storage 2200 may include a removable memory such as a hard disk drive (HDD), a solid state drive (SSD), a secure digital (SD) card, and/or an embedded memory such as an embedded multimedia card (eMMC).

The memory 2300 may, for example, temporarily store data processed or to be processed by the processor 2100. By way of example, the memory 2300 may temporarily store data that are obtained from signals OUT31 and OUT32 and processed by processor 2100.

As an example, the memory 2300 may include a volatile memory such as a static random access memory (SRAM), a dynamic RAM (DRAM), a synchronous DRAM (SDRAM), etc. and/or nonvolatile memory such as flash memory, phase-change RAM (PRAM), a magneto-resistive RAM (MRAM), a resistive RAM (ReRAM), a ferro-electric RAM (FRAM), etc. Alternatively, the memory 2300 may include heterogeneous memories.

The user interface 2400 may mediate communication between a user of the electronic device 2000 and the electronic device 2000. For example, the user may input a command to the electronic device 2000 through the user interface 2400. Alternatively, the electronic device 2000 may provide the user with information generated by the processor 2100 through the user interface 2400.

In an example, the processor 2100 may process data obtained from the signals OUT31 and OUT32 to obtain information transferred from the outside of the human body communication system 1000. The processor 2100 may provide the user with information obtained based on the signals OUT31 and OUT32 through the user interface 2400.

The security module 2500 may process or store data that requires a high level of security. The security module 2500 may operate in a security mode based on various security platforms. Thus, the security module 2500 may protect the data requiring the high level of security from external attacks. For example, when data obtained based on signals OUT31 and OUT32 require the high level of security, the data may be stored in security module 2500.

In the present specification, a module may mean hardware capable of performing operations described with reference to a specific component, software that may be executed by hardware (e.g., a separate processor included in security module 2500) to perform the operations, or a functional and/or structural combination of hardware or software for driving hardware, but the module is not limited thereto.

The communication device 2600 may include various components for exchanging signals with another electronic device/system external to the electronic device 2000. For example, the communication device 2600 may mediate communication between another electronic device or system external to the electronic device 2000 and the electronic device 2000.

As an example, the communication device 2600 may include a modem communication interface connectable to wired local area networks (LANs), wireless local area networks (WLANs) such as wireless fidelity (Wi-Fi), wireless personal area networks (WPANs) such as a bluetooth, wireless universal serial bus (USB), a zigbee, a near field communication (NFC), a radio-frequency identification (RFID), a power line communication (PLC), or a mobile cellular network such as a 3rd Generation (3G), a 4th Generation (4G), a long term evolution (LTE), etc. The bluetooth interface may support bluetooth low energy (BLE).

Alternatively, the communication device 2600 may mediate communication performed with the human body as a medium. For example, the communication device 2600 may include the transmitter 1100 and the receiver 1200 of FIG. 1 configured to perform the human body communication. The communication device 2600 may perform the operations described with reference to FIGS. 2 to 10. Accordingly, the communication device 2600 may output signals including less noise and information obtained from the outside of the electronic device 2000.

The power manager 2700 may supply power to the components of the electronic device 2000. For example, the power manager 2700 may appropriately convert power received from a battery and/or an external power source, and transfer the converted power to the components of the electronic device 2000.

The bus 2800 may provide communication paths between components of the electronic device 2000. For example, the processor 2100, the storage 2200, the memory 2300, the user interface 2400, the security module 2500, the communication device 2600, and the power manager 2700 may exchange data (e.g., data obtained from signals OUT31 and OUT32) to one another through the bus 2800. The bus 2800 may be configured to support various types of communication formats that are used in the electronic device 2000.

According to an embodiment of the inventive concept, noise generated in human body communication is effectively removed, and thus data transmitted in human body communication is correctly received.

The contents described above are specific embodiments for implementing the inventive concept. The inventive concept may include not only the embodiments described above but also embodiments in which a design is simply or easily capable of being changed. In addition, the inventive concept may also include technologies easily changed to be implemented using embodiments. Therefore, the scope of the inventive concept is not limited to the described embodiments but should be defined by the claims and their equivalents.

What is claimed is:
1. A receiver comprising:
a first electrode receiving an input signal that includes a noise signal and a bio signal transmitted through a human body;
a second electrode receiving a reference signal;

a first filter circuit including an inductive element coupled between a first node and a second node, and configured to pass first frequency components of the input signal received through the first node to the second node, and to pass second frequency components of the reference signal received through the second node to the first node, the first node being coupled to the first electrode, the second node being coupled to the second electrode, wherein the first frequency components and the second frequency components are below a first cutoff frequency;

a second filter circuit including a first capacitive element configured to attenuate fifth frequency components among third frequency components of the input signal, and a second capacitive element configured to attenuate sixth frequency components among fourth frequency components of the reference signal, the third frequency components representing frequency components of the input signal except for the first frequency components, the fourth frequency components representing frequency components of the reference signal except for the second frequency components, wherein the fifth frequency components and the sixth frequency components are below a second cutoff frequency; and an amplifier configured to perform an amplification operation based on a difference between levels of the third frequency components including the attenuated fifth frequency components and levels of the fourth frequency components including the attenuated sixth frequency components, wherein the first cutoff frequency is higher than a frequency of the noise signal and lower than a frequency of the bio signal, wherein the first capacitive element is coupled between the first node and a third node, and the second capacitive element is coupled between the second node and a fourth node, wherein the second filter circuit further includes:
  a first resistive element coupled between a supply voltage terminal and the fourth node;
  a second resistive element coupled between the supply voltage terminal and the third node;
  a third resistive element coupled between the fourth node and a ground terminal; and
  a fourth resistive element coupled between the third node and the ground terminal, and
wherein the amplifier includes an inverting terminal coupled to the fourth node and a non-inverting terminal coupled to the third node.

2. The receiver of claim 1, wherein the second cutoff frequency is associated with at least one of an element value of the first capacitive element or an element value of the second capacitive element.

3. A receiver comprising:
  a first electrode receiving an input signal that includes a noise signal and a bio si mal transmitted through a human body;
  a second electrode receiving a reference signal;
  a first filter circuit including an inductive element coupled between a first node and a second node, and configured to pass first noise included in the noise signal received through the first node to the second node and to receive the reference signal through the second node, the first node being coupled to the first electrode, the second node being coupled to the second electrode;
  a second filter circuit configured to remove second noise included in the noise signal by passing the input signal from the first node to a third node, and to pass the reference signal from the second node to a fourth node; and
  an amplifier configured to amplify a difference between a level of the bio signal received through the third node and a level of the reference signal received through the fourth node, and to output data of the bio signal,
wherein a frequency of the noise signal is less than a frequency of the bio signal,
wherein the second filter circuit includes:
  a first capacitive element coupled between the first node and the third node;
  a second capacitive element coupled between the second node and the fourth node;
  a first resistive element coupled between a supply voltage terminal and the fourth node;
  a second resistive element coupled between the supply voltage terminal and the third node;
  a third resistive element coupled between the fourth node and a ground terminal; and
  a fourth resistive element coupled between the third node and the ground terminal, and
wherein the amplifier includes an inverting terminal coupled to the fourth node and receiving the reference signal and a non-inverting terminal coupled to the third node and receiving the bio signal.

4. The receiver of claim 3, wherein an element value of the inductive element is associated with a frequency of the first noise.

5. The receiver of claim 1, wherein the first cutoff frequency is associated with an element value of the inductive element.

* * * * *